July 11, 1967 H. J. MALAN 3,330,972

SINE WAVE THRESHOLD AND PHASE COMPARATOR

Filed Oct. 9, 1964 2 Sheets-Sheet 1

HOWARD J. MALAN
INVENTOR

BY Carl R. Brown
ATTORNEY

Alfons Valukonis
AGENT

| CONDITION | STATE OF FLIP-FLOP 84 | STATE OF FLIP-FLOP 86 |
|---|---|---|
| $E_s$ IS GREATER THAN AND IN PHASE WITH $E_r$ | SET | RESET |
| $E_s$ IS GREATER THAN AND OUT OF PHASE WITH $E_r$ | RESET | SET |
| $E_s$ IS LESS THAN AND IN PHASE WITH $E_r$ | RESET | RESET |
| $E_s$ IS LESS THAN AND OUT OF PHASE WITH $E_r$ | RESET | RESET |

HOWARD J. MALAN
INVENTOR.
BY Carl R. Brown
ATTORNEY
Alfons [illegible]
AGENT

United States Patent Office 3,330,972

Patented July 11, 1967

3,330,972

SINE WAVE THRESHOLD AND PHASE COMPARATOR

Howard J. Malan, San Diego, Calif., assignor to General Dynamics Corporation, San Diego, Calif., a corporation of Delaware Filed Oct. 9, 1964, Ser. No. 402,845
5 Claims. (Cl. 307—88.5)

This invention relates generally to a signal comparator, and more particularly pertains to a device for continuously comparing a sinusoidal input signal with a sinusoidal reference signal to indicate deviations of the input signal from the reference signal with respect to magnitude and phase.

Accordingly, an object of the invention is to provide a signal comparator capable of indicating when an input signal changes in magnitude and phase with respect to a reference signal.

Another object of the invention is the provision of a signal comparator that recognizes a small difference in magnitude of an input signal with respect to a reference signal and indicates that difference.

One other object of this invention is the provision of a signal comparator which recognizes a 180° difference in phase of a sinusoidal input signal with respect to a sinusoidal reference signal and indicates the difference.

Still another object of this invention is the provision of a signal comparator capable of continuously comparing an input signal with a reference signal and indicating changes in magnitude and phase with respect to the reference signal.

According to this invention there is provided a first pair of emitter connected transistors, the collectors of which being connected through a pair of in series impedances having a common connection. A unidirectional current conducting means is connected to the common connection and is responsive to a gating signal for supplying pulsating unidirectional current to the common connection during positive half-cycle portions of the gating signal. An input signal and a reference signal in phase with the gating signal are separately applied to different bases of the transistors to effect equal current flow to both the transistors when the input and reference signals are equal and to effect a greater current flow to one of the transistors when the input and reference signals are unequal or out of phase. A second pair of emitter connected transistors are provided whose bases are separately connected to a collector of one of the transistors of the first pair. A circuit means is provided which develops reverse bias on the second pair of transistors when current flow to both transistors of the first pair of transistors is equal and to develop forward bias on one transistor of the second pair of transistors to effect an output therefrom when the current flow to one transistor of the first pair of transistors is greater.

This invention contemplates other objects, features, and advantages which will become apparent from the following detailed description taken in conjunction with the accompanying drawings which illustrate a preferred embodiment of the invention and in which.

Figure 1:
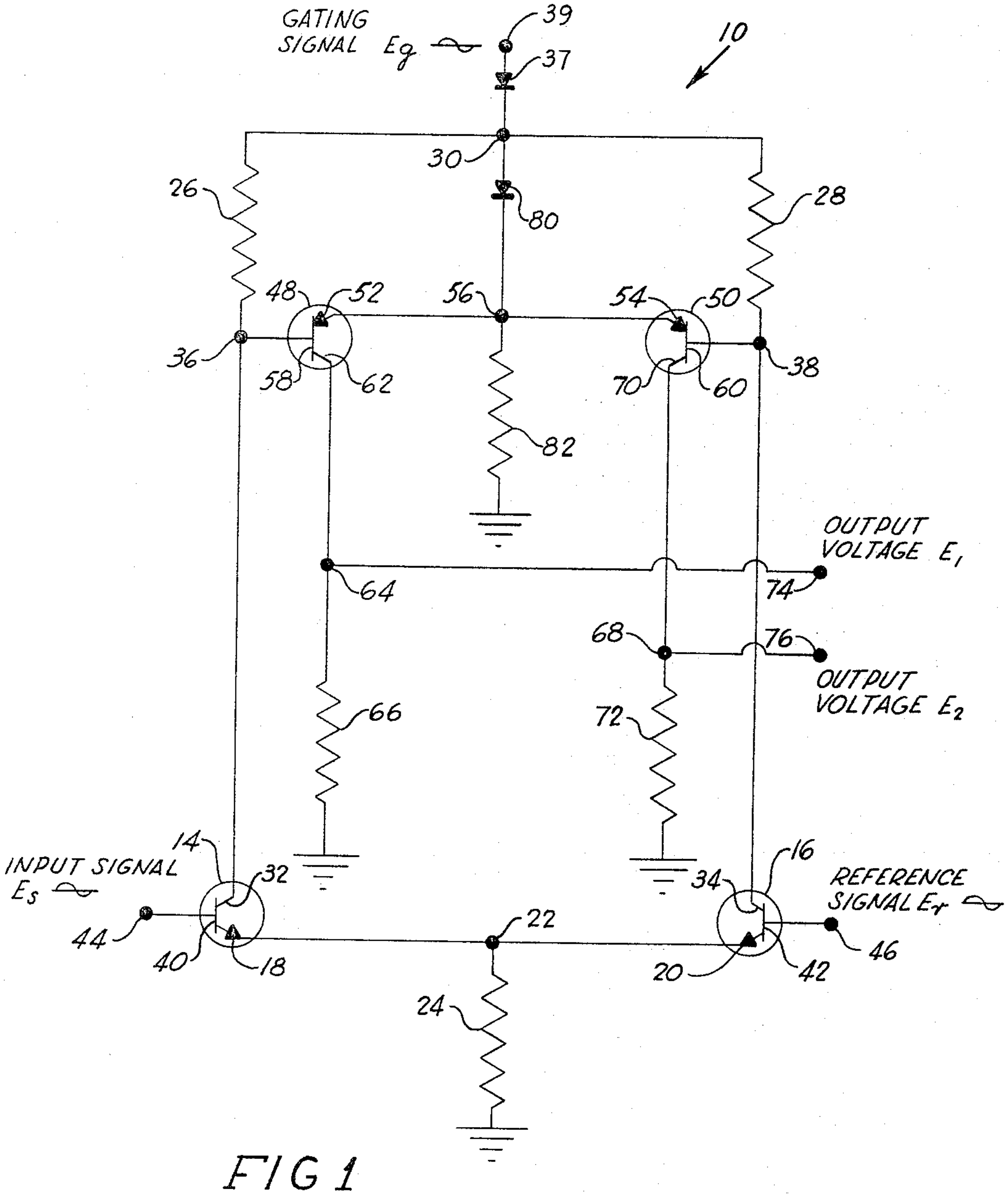
FIGURE 1 is a schematic showing of the details of the invention.

Referring now particularly to FIGURE 1, the numeral 10 generally designates the threshold and phase comparator circuit of the present invention.

A first pair of transistors 14 and 16 is designated as being of the N-P-N type for illustrative purposes, but could be of different conductivity, as for example, of the P-N-P type, as will hereinafter be more clearly apparent. The emitters 18 and 20 are connected to each other at a connection 22. A resistor 24 is connected to the connection 22 and to ground.

A pair of resistors 26 and 28, of equal value, are connected to each other in series at a connection 30 and in series with the collectors 32 and 34 of the transistors 14 and 16 at the connections 36 and 38. A diode 37 is connected to connection 30 and a terminal 39 to which a gating signal $E_g$ is to be applied from a source (not shown).

The bases 40 and 42 of the transistors 14 and 16 are connected to terminals 44 and 46, respectively. The terminal 44 being adapted for connection to a source (not shown) which provides an input signal $E_s$ and the terminal 46 being adapted for connection to a source (not shown) which supplies a reference signal $E_r$.

A second pair of transistors 48 and 50 of the P-N-P type is shown as having the emitters 52 and 54 connected to each other at a connection 56. It is to be understood that the transistors 48 and 50 could be of the N-P-N type. The base 58 of transistor 48 is connected to the connection 36 and the base 60 of the transistor 50 is connected to the connection 38. The collector 62 of the transistor 48 is connected to a connection 64 which has a resistor 66 connected thereto and to ground. A connection 68 connects the collector 70 of transistor 50 to a resistor 72 which is in turn connected to ground. Output terminals 74 and 76 are connected to connections 64 and 68, respectively, whereon appear the output voltages $E_1$ and $E_2$, as will hereinafter be more fully described.

A circuit involving a diode 80 and a resisor 82 is shown with the diode 80 connected to the connections 30 and 56 and the resistor 82 connected to the connection 56 and ground.

A practical circuit according to FIGURE 1 may have the following values of circuit elements:

| | |
|---|---|
| N-P-N Transistor 14 and 16 | 2N1613. |
| P-N-P Transistors 48 and 50 | 2N1233. |
| Diodes 37 and 80 | 1N485. |
| Resistor 24 | 4,700 ohms. |
| Resistors 26 and 28 | 8,200 ohms each. |
| Resistors 66 and 72 | 47,000 ohms each. |
| Resistor 82 | 15,000 ohms. |

In the above practical circuit typical values for the gating and reference signals $E_g$ and $E_r$ could be 26 volts and 1.5 volts, respectively. A typical voltage drop across the diode 80 could be .6 volt.

In operation, assuming initially that the gating signal $E_g$ on terminal 39 becomes positive with respect to ground, a "conventional" current will flow through the diode 37 to the connection 30, through diode 80 to connection 56, and through resistor 82 to ground. Since the emitters 52 and 54 of the transistors 48 and 50 are both connected to connection 56, and the bases 58 and 60 are connected through resistors 26 and 28, respectively, to the connection 56, the voltage drop across diode 80 provides an emitter-base reverse bias for both transistors 48 and 50.

Assume now that the applied input and reference signals $E_s$ and $E_r$ are exactly the same in magnitude during the positive half-cycle of the gating signal $E_g$. This occurs only when $E_s$ and $E_r$ are in phase. The following takes place: The input signal $E_s$ which is applied to terminal 44 causes a base 40 to emitter 18 current flow in the transistor 14. In like manner the reference signal $E_r$ applied to the terminal 46 causes a base 42 to emitter 20 current flow in the transistor 16. Thus, since both the transistors 14 and 16 now have base to emitter forward bias, collector to emitter current will flow in each. The collector current for both transistors 14 and 16 is supplied at the terminal 39 to which the gating signal $E_g$ is applied through diode 37 to the connection 30 where it divides and flows through the resistors 26 and 28 to the connections 36 and 38. From connection 36 current flows through the collector 32 to the emitter 18 of the transistor 14. Equally so current will flow from connection 38 to collector 34 and emitter 20 of the transistor 16. The emitter 18 current of transistor 14 and the emitter 20 current of the transistor 16 will combine at connection 22 and then flow through resistor 24 to ground. Under these conditions wherein $E_s$ and $E_r$ are equal, the resistors 26 and 28 should be of such value that the voltage drop across each one of them is not greater than the voltage developed across diode 80 and applied to both the transistors 48 and 50 in the form of a reverse bias. Hence neither transistor 48 nor transistor 50 will conduct, with no voltage being developed across either of the resistors 66 and 72, and therefore there will be no output voltage $E_1$ or output voltage $E_2$ developed at the terminals 74 and 76, respectively.

Assume now that the input signal $E_s$ becomes greater in magnitude than the reference signal $E_r$ with respect to ground during the positive alternation of the gating signal $E_g$. This condition can occur only when $E_s$ and $E_r$ are in phase. Now a greater base 40 to emitter 18 current flows in the transistor 14 which results in a higher voltage at connection 22 than appeared previously. This rise in voltage at connection 22 also appears at the emitter 20 of transistor 16 and results in a reverse bias of transistor 16. Collector 32 of transistor 14 now carries a larger current than before and the resultant increase in the voltage drop across the resistor 26 is enough to overcome the reverse bias developed in the transistor 48 by the diode 80 such that an emitter 52 to base 58 current flows in transistor 48 to connection 36. This current turns on the transistor 48 and causes it to conduct such that a voltage drop appears across the resistor 66 and at the terminal 74 as the output voltage $E_1$.

Consider now the condition where the input signal $E_s$ becomes less positive than the reference signal $E_r$ with respect to ground during the positive alternation of $E_g$. This condition can occur when $E_s$ is either in phase or 180° out of phase with $E_r$. A similar operation as that just previously described occurs except that a reverse bias is developed in transistor 14 and the collector 34 of transistor 16 now carries a larger current than before. The increased voltage drop across resistor 28 overcomes the reverse bias developed in transistor 50 by the diode 80 and it turns on with a voltage being developed across the resistor 72 which now appears as the output voltage $E_2$ at 76.

Accordingly, in brief summation of the above operation: If an output voltage $E_1$ appears at the terminal 74 it is an indication that the input signal $E_s$ is greater in magnitude than the reference or threshold signal $E_r$ and that $E_s$ is in phase with $E_r$. However, if an output voltage $E_2$ appears at the terminal 76 it describes $E_s$ as being smaller in magnitude than $E_r$ or 180° out of phase with $E_r$.

Figures 2, 3:
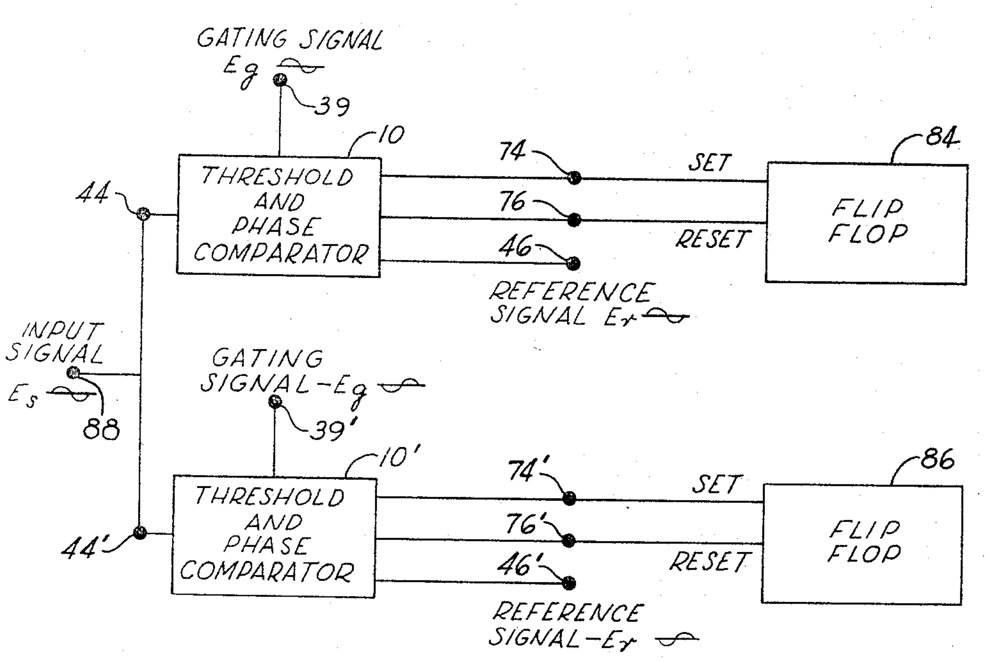
FIGURE 2 is a block diagram illustrating a preferred application of the present invention.
FIGURE 3 is a table setting forth certain conditions encountered in the preferred application of FIGURE 2 and the states adopted by the flip-flops as a result of these conditions.

Referring now to FIGURE 2 there is shown a preferred application of the invention which is capable of providing a complete description of an input signal $E_s$. In this arrangement the above described threshold and phase comparator circuit 10 is utilized in conjunction with another comparator 10′ of like construction. The comparator circuit 10 has the terminal 74 connected to the "SET" input of a conventional flip-flop 84, such as a bi-stable multivibrator, and the terminal 76 connected to the "RESET" input of the flip-flop. The comparator circuit 10′ has output terminals 74′ and 76′, which are comparable to the output terminals 74 and 76 of the comparator circuit 10, connected to the "SET" and "RESET" inputs, respectively, of yet another flip-flop designated by the numeral 86. The flip-flop 86 can be of the same construction as the flip-flop 84, it being required only that it have two stable states. The comparator 10′ has terminals 39′, 44′, and 46′ which are comparable to the terminals 39, 44, and 46, respectively, of the comparator circuit 10. As previously set forth, the terminal 39 is adapted to be connected to a source (not shown) which is capable of supplying a sinusoidal gating signal $E_g$. Equally so that terminal 46 is adapted to have applied thereto a reference signal $E_r$ in phase with the gating signal $E_g$. Comparator circuit 10′, on the other hand, is adapted to receive at the terminal 39′ a gating signal $-E_g$ from a source (not shown) which is 180° out of phase with the gating signal $E_g$, but otherwise similar thereto. At terminal 46′ a reference signal $-E_r$, equal in all respects to the reference signal $E_r$, but 180° out of phase, is also applied from a source (not shown).

In operation, the arrangement of FIGURE 2 is useful in providing information about the input signal $E_s$, particularly when $E_s$ exceeds $E_r$ in magnitude and also if it is in phase or 180° out of phase with $E_r$. Referring to FIGURE 3, it can be seen that when $E_s$ is greater in magnitude than $E_r$ and is in phase with $E_r$, flip-flop 84 will be in the "SET" state and the flip-flop 86 will be in the "RESET" state. However, when $E_s$ is 180° out of phase with $E_r$ but still greater in magnitude than $E_r$, the flip-flop 84 will be in the "RESET" state and the flip-flop 86 will be in the "SET" state. When both flip-flops 84 and 86 are in the "RESET" state this is an indication that $E_s$ is smaller in magnitude than $E_r$ and either in phase or 180° out of phase with $E_r$.

Although a specific embodiment of the present invention has been described and illustrated in detail, it is to be understood that the invention is not limited thereto as many variations will be readily apparent to those skilled in the art and the invention is to be given its broadest possible interpretation within the terms of the appended claims.

What I claim is:

1. A threshold and phase comparator circuit comprising a first pair of emitter connected transistors, the collectors of said transistors being connected through a pair of in series impedances having a common connection, unidirectional current conducting means connected to said common connection and responsive to a gating signal for supplying pulsating unidirectional current to said common connection during positive half-cycle portions of the gating signal, means for applying an input signal and a reference signal in phase with the gating signal separately to different bases of said transistors to effect equal current flow to both said transistors when the input and reference signals are equal and to effect greater current flow to one of said transistors when the input and reference signals are unequal or out of phase, a second pair of emitter connected transistors, the bases of said second pair of transistors being separately connected to a collector of one transistor of said first pair of transistors, and circuit means connected to said common connection for conducting current from said common connection, said circuit means comprising current conducting means connected to the emitters of said second pair of transistors, and cooperable with said pair of impedances to develop emitter-base reverse bias on both transistors of said second pair of transistors when the current flow to both transistors of said first pair of transistors is equal and to develop emitter-base forward bias on one transistor of said second pair of transistors to effect output therefrom when the current flow to one transistor of said first pair of transistors is greater.

2. A threshold and phase comparator circuit comprising a first pair of emitter connected transistors of like conductivity, the collectors of said transistors being connected through a pair of in series impedances having a common connection, unidirectional current conducting means connected to said common connection and responsive to a gating signal for supplying pulsating unidirectional current to said common connection during positive half-cycle portions of the gating signal, means for applying an input signal and a reference signal in phase with the gating signal separately to different bases of said transistors to effect equal current flow to both said transistors when the input and reference signals are equal and to effect greater current flow to one of said transistors when the input and reference signals are unequal or out of phase, a second pair of emitter connected transistors, the bases of said second pair of transistors of different conductivity than said first pair of transistors being separately connected to a collector of one transistor of said first pair of transistors, and circuit means connected to said common connection for conducting current from said common connection, said circuit means comprising current conducting means connected to the emitters of said second pair of transistors, and cooperable with said pair of impedances to develop emitter-base reverse bias on both transistors of said second pair of transistors when the current flow to both transistors of said first pair of transistors is equal and to develop emitter-base forward bias on one transistor of said second pair of transistors to effect output therefrom when the current flow to one transistor of said first pair of transistors is greater.

3. A threshold and phase compartor circuit comprising a first pair of emitter connected transistors of like conductivity, the collectors of said transistors being connected through a pair of in series impedances having a common connection, diode means connected to said common connection and responsive to a gating signal for supplying pulsating unidirectional current to said common connection during positive half-cycle portions of the gating signal, means for applying an input signal and a reference signal in phase with the gating signal separately to diffent bases of said transistors to effect equal current flow to both said transistors when the input and reference signals are equal and to effect greater current flow to one of said transistors when the input and reference signals are unequal or out of phase, a second pair of emitter connected transistors of different conductivity than said first pair of transistors, the bases of said second pair of transistors being separately connected to a collector of one transistor of said first pair of transistors, and circuit means connected to said common connection for conducting current from said common connection, said circuit means comprising current conducting means connected to the emitters of said second piar of transistors, and cooperable with said pair of impedances to develop emitter-base reverse bias on both transistors of said second pair of transistors when the current flow to both transistors of said first pair of transistors is equal and to develop emitter-base forward bias on one transistor of said second pair of transistors to effect output therefrom when the current flow to one transistor of said first pair of transistors is greater.

4. A threshold and phase comparator circuit as set forth in claim 3 wherein said current conducting means comprises diode means.

5. A threshold and phase comparator circuit as set forth in claim 4, said circuit means further comprising impedance means connected to the emitters of said second pair of transistors and adapted for connection to a common ground connection.

References Cited

UNITED STATES PATENTS

| | | | |
|---|---|---|---|
| 2,221,517 | 1/1940 | Holters | 328—134 |
| 3,204,121 | 8/1965 | Riley | 307—88.5 |

ARTHUR GAUSS, *Primary Examiner.*

R. H. EPSTEIN, *Assistant Examiner.*